United States Patent
Amanuma

(10) Patent No.: US 8,427,182 B2
(45) Date of Patent: Apr. 23, 2013

(54) TEST APPARATUS AND POWER SUPPLY APPARATUS

(75) Inventor: Seiji Amanuma, Saitama (JP)

(73) Assignee: Advantest Corporation, Tokyo (JP)

( * ) Notice: Subject to any disclaimer, the term of this patent is extended or adjusted under 35 U.S.C. 154(b) by 313 days.

(21) Appl. No.: 12/861,695

(22) Filed: Aug. 23, 2010

(65) Prior Publication Data

US 2011/0128020 A1  Jun. 2, 2011

(30) Foreign Application Priority Data

Sep. 4, 2009 (JP) ................................. 2009-205254

(51) Int. Cl.
*G01R 31/00* (2006.01)

(52) U.S. Cl.
USPC ............ 324/750.01; 324/762.02; 324/764.01; 307/115

(58) Field of Classification Search ............. 324/750.01, 324/762.02, 764.01; 307/71, 115
See application file for complete search history.

(56) References Cited

U.S. PATENT DOCUMENTS

| | | | | |
|---|---|---|---|---|
| 5,289,118 | A * | 2/1994 | Crisafulli | 324/756.02 |
| 5,568,035 | A * | 10/1996 | Kato et al. | 320/166 |
| 6,391,667 | B1 * | 5/2002 | Hashimoto | 438/17 |
| 7,514,819 | B2 * | 4/2009 | Kichline, Jr. | 307/108 |
| 7,911,242 | B2 * | 3/2011 | Watanabe et al. | 327/107 |
| 2002/0085397 | A1 * | 7/2002 | Suzui et al. | 363/37 |
| 2002/0125904 | A1 | 9/2002 | Eldridge et al. | |
| 2002/0186037 | A1 | 12/2002 | Eldridge et al. | |
| 2007/0197168 | A1 | 8/2007 | Amanuma et al. | |
| 2009/0243563 | A1 | 10/2009 | Saito | |

FOREIGN PATENT DOCUMENTS

| | | |
|---|---|---|
| JP | H04-235357 A | 8/1992 |
| JP | H09-162255 A | 6/1997 |
| JP | 2000-346906 A | 12/2000 |
| JP | 2004-173464 A | 6/2004 |
| JP | 2005-516226 A | 6/2005 |
| JP | 2007-205793 A | 8/2007 |
| JP | 2007-207585 A | 8/2007 |
| JP | 2008-107256 A | 5/2008 |
| JP | 2009-245432 A | 10/2009 |

OTHER PUBLICATIONS

Japanese Office Action dated Apr. 12, 2011, in a counterpart Japanese patent application No. 2010-231912, citing Foreign Patent document No. 1 listed above and JP2007-205793, JP2004-173464, JP2007-207585, JP H09-162255, JP2005-516226, and JP2000-346906.

Japanese Office Action dated Nov. 24, 2010 in a counterpart Japanese patent application of Application No. JP2010-231912.

The explanation of circumstances concerning the accelerated examination dated Jan. 14, 2010, in a counterpart Japanese patent application JP2009-205254 submitted to Japanese Patent Office.

* cited by examiner

*Primary Examiner* — Arleen M Vazquez

(57) ABSTRACT

Provided is a test apparatus that tests a device under test, comprising a plurality of capacitors that are each charged to a predetermined voltage; a switching section that switches which of the capacitors charged to a predetermined voltage supplies power to the device under test; and a judging section that judges acceptability of the device under test based on an operational result of the device under test. Also provided is a test apparatus that selects one of a plurality of capacitors and a corresponding one of a plurality of power supply units, according to content of a test performed after a test that uses another of the capacitors to supply power to the device under test.

10 Claims, 8 Drawing Sheets

TEST APPARATUS AND POWER SUPPLY APPARATUS

BACKGROUND

1. Technical Field

The present invention relates to a test apparatus and a power supply apparatus.

2. Related Art

In a test that includes applying voltage to an electronic device, capacitors charged to a predetermined voltage are connected to a device under test and the power charged in the capacitors is supplied to the device under test. Japanese Patent Application Publication No. 2000-346906 describes a test that involves applying power charged in capacitors to a device under test.

The time necessary for charging the capacitors is longer than the testing time needed to apply the voltage to the device under test. For example, even though the test time needed to apply the voltage to the device under test is only 1 millisecond, the time needed to charge the capacitors can be 100 milliseconds. As a result, the time required for testing increases due to the limitation imposed by the time needed to charge the capacitors.

Furthermore, when the power charged in the capacitors is used to repeatedly test the device under test, the repeated charging and discharging of the capacitors leads to degradation of the capacitors. To counter this, when testing, film capacitors that exhibit relatively small decreases in lifetime due to repeated charging and discharging are used. These film capacitors, however, have larger volumes than electrolytic capacitors having equivalent electrostatic capacitance, and therefore it becomes difficult to miniaturize the test apparatus.

SUMMARY

Therefore, it is an object of an aspect of the innovations herein to provide a test apparatus and a power supply apparatus, which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, provided is a test apparatus that tests a device under test, comprising a plurality of capacitors that are each charged to a predetermined voltage; a switching section that switches which of the capacitors charged to a predetermined voltage supplies power to the device under test; and a judging section that judges acceptability of the device under test based on an operational result of the device under test.

According to an aspect related to the innovations herein, provided is the test apparatus further comprising a power supply section that charges the capacitors to the predetermined voltages.

According to an aspect related to the innovations herein, provided is the test apparatus wherein the power supply section charges at least one capacitor that is not supplying power to the device under test to a voltage corresponding to content of a test performed after a test using another of the capacitors that supplies power to the device under test.

According to an aspect related to the innovations herein, provided is the test apparatus wherein the power supply section includes a plurality of power supply units, each power supply unit is provided to correspond to one of the capacitors and to charge the corresponding capacitor, and the switching section selects one of the capacitors and a corresponding one of the power supply units, according to content of a test performed after a test that uses another of the capacitors to supply power to the device under test.

According to an aspect related to the innovations herein, provided is the test apparatus wherein when an amount of current needed to test the device under test is greater than a predetermined value, the switching section connects two or more of the capacitors to the device under test in parallel.

According to an aspect related to the innovations herein, provided is the test apparatus further comprising a monitoring section that monitors degradation amounts of the capacitors.

According to an aspect related to the innovations herein, provided is the test apparatus wherein the monitoring section displays a warning when degradation information corresponding to the degradation amounts indicates a value in a predetermined range.

According to an aspect related to the innovations herein, provided is the test apparatus wherein, when the degradation information of one of the capacitors indicates a value within the predetermined range, the power supply section charges the capacitor whose degradation information indicates the value in the predetermined range to a voltage that is less than a voltage to which the capacitor was charged before the degradation information indicated the value in the predetermined range.

According to an aspect related to the innovations herein, provided is the test apparatus wherein the switching section stops the supply of power to the device under test from the capacitors according to operation of the device under test.

According to an aspect related to the innovations herein, provided is the test apparatus wherein the switching section connects two or more of the capacitors to the device under test in series.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
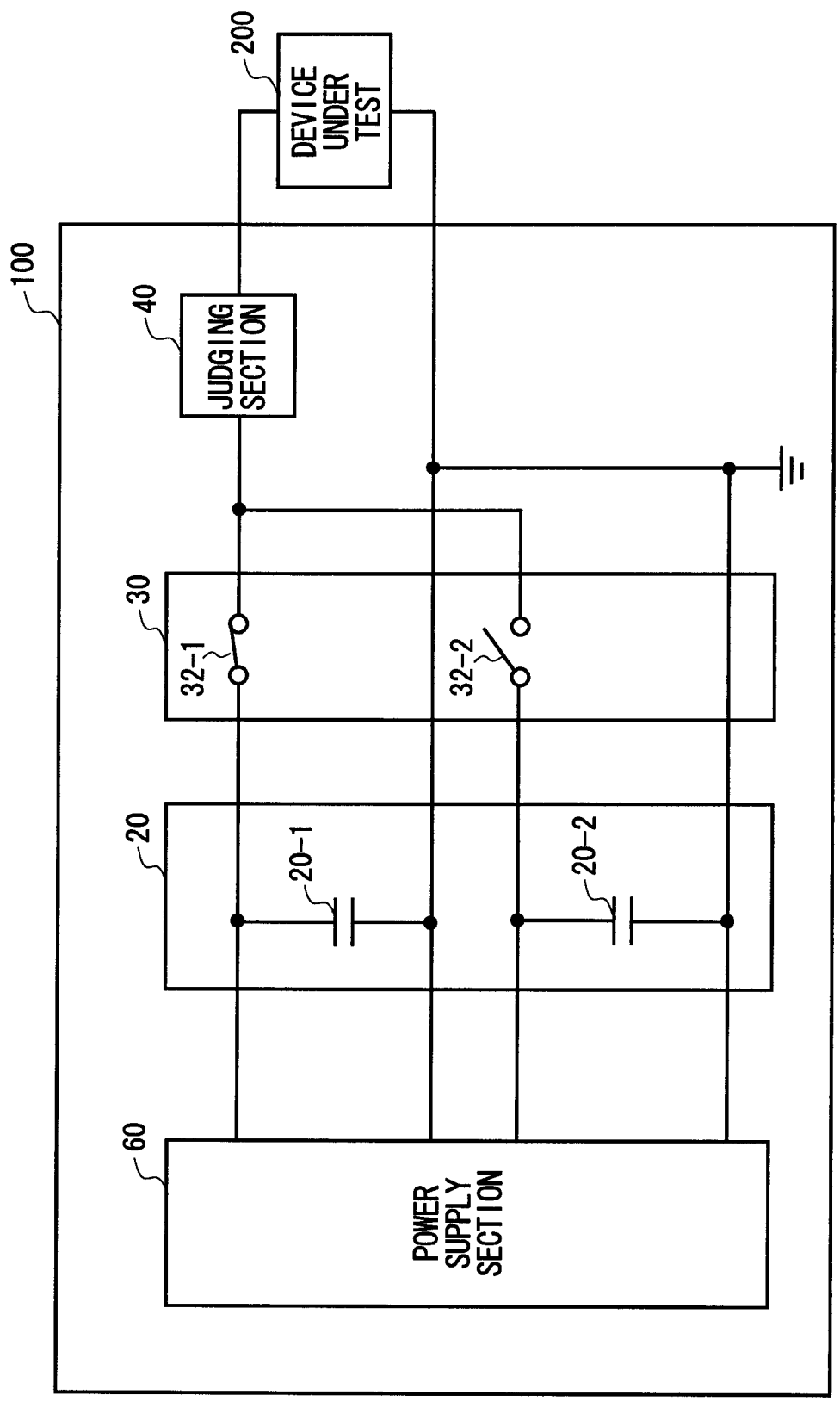
FIG. 1 shows an exemplary configuration of a test apparatus 100 according to an embodiment of the present invention, along with a device under test 200.

FIG. 1 shows an exemplary configuration of a test apparatus 100 according to an embodiment of the present invention, along with a device under test 200. The test apparatus 100 tests the device under test 200 by applying thereto a predetermined voltage.

The test apparatus 100 includes a plurality of capacitors 20-1 and 20-2, a switching section 30, a judging section 40, and a power supply section 60. The power supply section 60 charges the capacitors 20 to the voltage for testing the device under test 200. The power supply section 60 charges each capacitor 20 to a predetermined voltage. The switching section 30 switches which of the capacitors 20 charged to the predetermined voltage supplies the device under test 200 with supply power.

The switching section 30 includes a plurality of switches 32-1 and 32-2. The switches 32-1 and 32-2 respectively switch whether the capacitors 20-1 and 20-2 are connected to the device under test 200 via the judging section 40 (referred to hereinafter as the "ON" state) or are disconnected from the device under test 200 (referred to hereinafter as the "OFF" state). The switches 32-1 and 32-2 may be semiconductor switches or mechanical relays.

When the power charged in the capacitor 20-1 is to be supplied to the device under test 200, the switching section 30 turns the switch 32-1 ON. When the power charged in the capacitor 20-2 is to be supplied to the device under test 200, the switching section 30 turns the switch 32-2 ON. Furthermore, when the capacitor 20-1 is to be charged, the switching section 30 turns the switch 32-1 OFF. When the capacitor 20-2 is to be charged, the switching section 30 turns the switch 32-2 OFF. The switching section 30 may include a control circuit having a processor to control the ON/OFF states of the switch 32-1 and the switch 32-2 according to a program or the like.

The judging section 40 judges acceptability of the device under test 200 based on operational results of the device under test 200. The judging section 40 may be provided between the switching section 30 and the device under test 200. The judging section 40 may judge the acceptability of the device under test 200 by measuring current flowing through the device under test 200 when a predetermined voltage is applied thereto, for example. The judging section 40 may judge the device under test 200 to be acceptable when the current flowing through the device under test 200 is within a predetermined range of current values according to the applied voltage. The judging section 40 may supply the device under test 200 with a test signal having a predetermined pattern. The judging section 40 may then judge acceptability of the device under test 200 by comparing a predetermined value to the signal output by the device under test 200 in response to the test signal.

The power supply section 60 charges the capacitor 20-1 and the capacitor 20-2 with a voltage corresponding to the content of the test for the device under test 200. For example, when performing a series of tests the involve applying the same voltages to the device under test 200, the power supply section 60 may apply the same voltages to the capacitor 20-1 and the capacitor 20-2. On the other hand, when performing tests that involve sequentially applying different voltages to the device under test 200, the power supply section 60 may apply different voltages to the capacitor 20-1 and the capacitor 20-2.

Specifically, when repeating a test that involves applying a voltage of 1 kV to the device under test 200, the power supply section 60 charges each of the capacitor 20-1 and the capacitor 20-2 with a voltage of 1 kV. When the capacitor 20-1 is charged to the voltage of 1 kV, the switching section 30 turns ON the switch 32-1 to apply the voltage of 1 kV charged in the capacitor 20-1 to the device under test 200. The judging section 40 then measures the current value flowing through the device under test 200 when the voltage of 1 kV is applied by the capacitor 20-1. The judging section 40 judges acceptability of the device under test 200 according to whether the measured current value is within a predetermined value range corresponding to an applied voltage of 1 kV.

Next, when the capacitor 20-2 is charged with a voltage of 1 kV, the switching section 30 turns ON the switch 32-2 to apply the voltage of 1 kV charged in the capacitor 20-2 to the device under test 200. The judging section 40 judges acceptability of the device under test 200 based on the measurement of the current value that flows when the voltage of 1 kV from the capacitor 20-2 is applied.

The power supply section 60 charges the capacitor 20-1 while the switch 32-1 is OFF. The power supply section 60 charges the capacitor 20-2 while the switch 32-2 is OFF. The power supply section 60 switches between charging the capacitor 20-1 and charging the capacitor 20-2, in synchronization with a timing at which the switching section 30 sequentially switches the switch 32-1 and the switch 32-2 between the ON and OFF states.

In the manner described above, the test apparatus 100 of the present embodiment sequentially switches which of the capacitor 20-1 and the capacitor 20-2 applies voltage to the device under test 200. The power supply section 60 charges one of the capacitor 20-1 and the capacitor 20-2 while the other is applying voltage to the device under test 200, thereby decreasing the charging time. As a result, the time needed to test the device under test 200 can be decreased.

In the test apparatus 100 of the present embodiment, the number of times that the capacitor 20-1 and the capacitor 20-2 are each charged and discharged is substantially half of the number of tests of the device under test 200. Accordingly, there is less degradation the capacitor 20-1 and the capacitor 20-2 than when a single capacitor is used. Therefore, the capacitor 20-1 and the capacitor 20-2 may be electrolytic capacitors, which are smaller than film capacitors. By using electrolytic capacitors for the capacitor 20-1 and the capacitor 20-2, the test apparatus 100 can be formed to be smaller than when film capacitors are used.

When sequentially switching the voltage applied to the device under test 200, the power supply section 60 may charge each of the capacitor 20-1 and the capacitor 20-2 with a different voltage. For example, when alternating between a test that involves applying a first voltage, such as 1 kV, to the device under test 200 and a test that involves applying a second voltage, such as 2 kV, to the device under test 200, the power supply section 60 charges the capacitor 20-1 to the first voltage and charges the capacitor 20-2 to the second voltage.

When the capacitor 20-1 is charged to the first voltage, the switching section 30 turns ON the switch 32-1 to apply the first voltage charged in the capacitor 20-1 to the device under test 200. The power supply section 60 charges the capacitor 20-2 to the second voltage while the switch 32-1 is ON. Next, when the capacitor 20-1 is finished discharging and the capacitor 20-2 is charged to the second voltage, the switching section 30 turns ON the switch 32-2 to apply the second voltage charged in the capacitor 20-2 to the device under test 200. The power supply section 60 charges the capacitor 20-1 to the first voltage while the switch 32-2 is ON.

By charging a plurality of different capacitors 20-1 and 20-2 respectively to the first voltage and the second voltage in this way, the test apparatus 100 can decrease the fluctuation in a difference between the voltage during charged states and the voltage during discharged states of the capacitor 20-1 and the capacitor 20-2, thereby decreasing the power consumption. For example, when the capacitor 20-1 is charged to 1 kV and used and is thereafter charged to 2 kV, the amount of consumed power corresponds to a voltage difference of 1 kV or more. When the capacitor 20-1 is always charged to 2 kV, however, the consumed power is lower, corresponding to a voltage difference of 1 kV or less.

Figure 2:
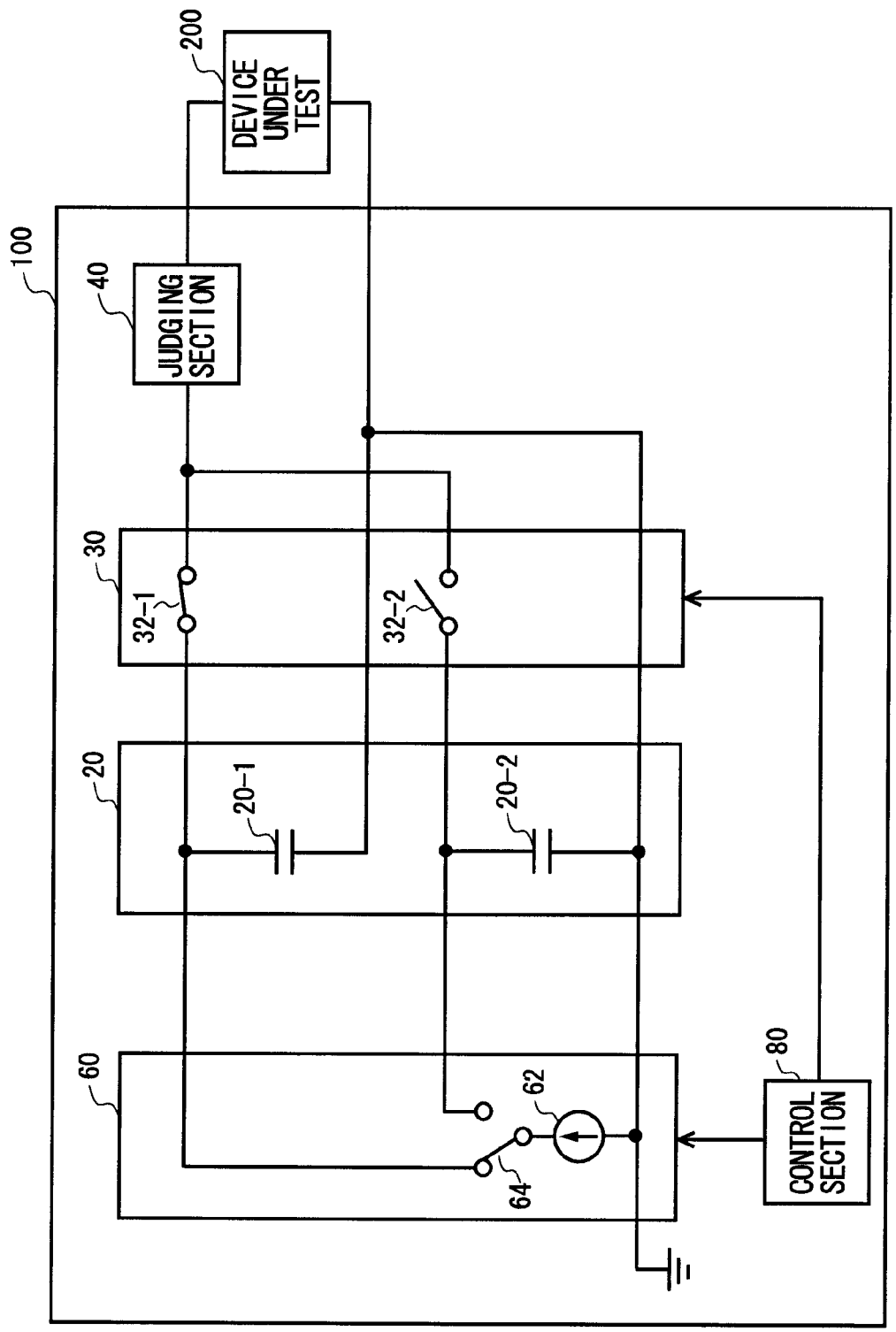
FIG. 2 shows a configuration of the test apparatus 100 according to another embodiment, along with the device under test 200.

FIG. 2 shows a configuration of the test apparatus 100 according to another embodiment, along with the device under test 200. The test apparatus 100 of FIG. 2 further includes a control section 80 in addition to the configuration of the test apparatus 100 of FIG. 1. Furthermore, the power supply section 60 includes a power supply unit 62 and a switch 64. The control section 80 controls the voltage output by the power supply unit 62.

The switch 64 switches which of the capacitor 20-1 and the capacitor 20-2 is connected to the power supply unit 62. The control section 80 may switch the position of the switch 64 in synchronization with the timing at which the switch 32-1 and the switch 32-2 switch between the ON and OFF states. Specifically, when the switch 32-1 is ON, the control section 80 switches the switch 64 such that the voltage from the power supply unit 62 is applied to the capacitor 20-2. When the switch 32-2 is ON, the control section 80 switches the switch 64 such that the voltage from the power supply unit 62 is applied to the capacitor 20-1.

Figure 3:
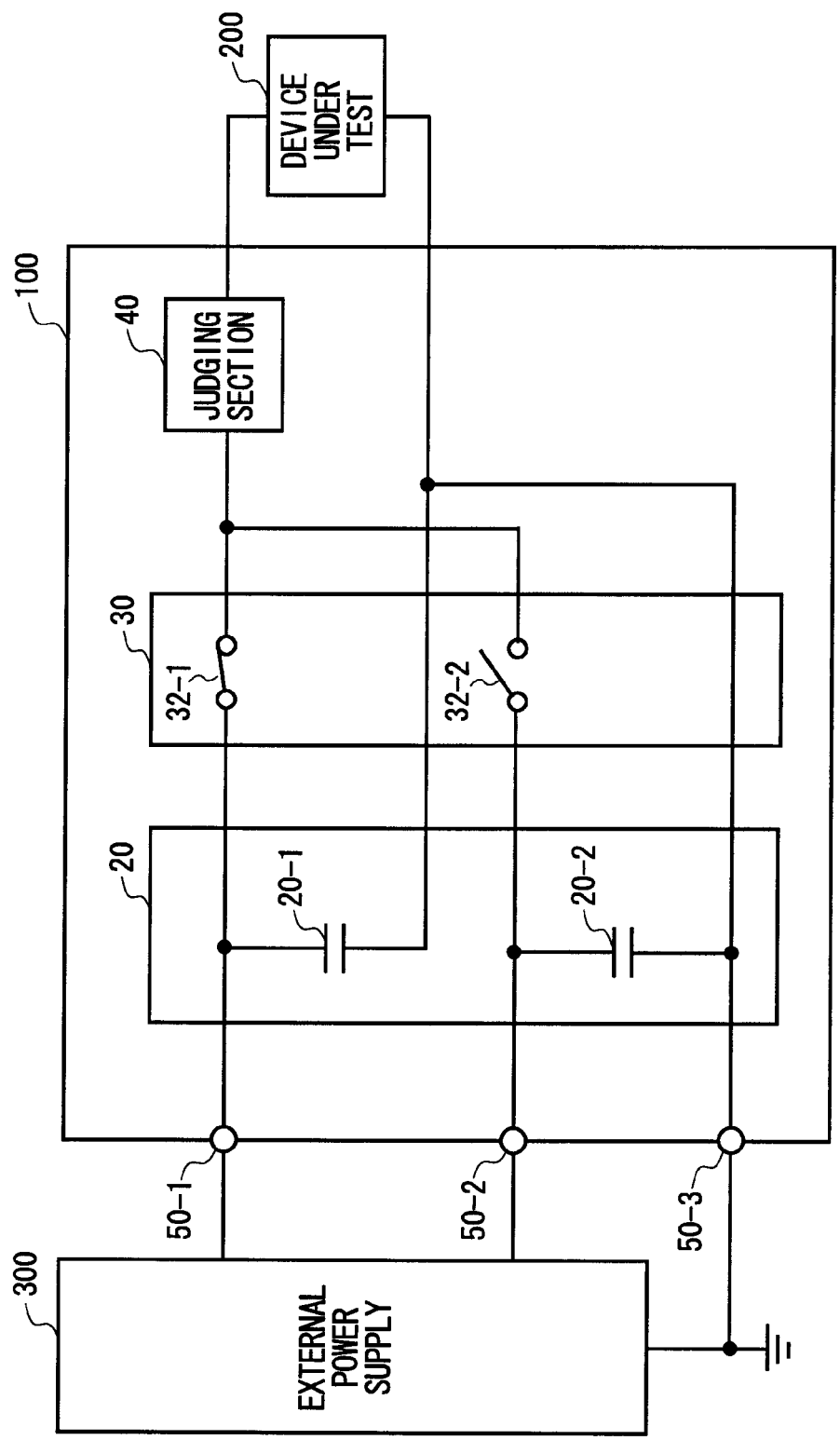
FIG. 3 shows a configuration of the test apparatus 100 according to another embodiment, along with the device under test 200 and an external power supply 300.

FIG. 3 shows a configuration of the test apparatus 100 according to another embodiment, along with the device under test 200 and an external power supply 300. The test apparatus 100 of FIG. 3 differs from the test apparatus 100 of FIG. 1 by not including the power supply section 60. The external power supply 300 supplies the test apparatus 100 with a test voltage to be applied to the device under test 200. The external power supply 300 may have the same function as the power supply section 60 of FIG. 1.

The power supply connection terminals 50 are terminals for connecting the external power supply 300. Power supply terminals of the external power supply 300 are connected to the power supply connection terminal 50-1 and the power supply connection terminal 50-2. A ground terminal of the external power supply 300 is connected to the power supply connection terminal 50-3. The same power supply terminal of the external power supply 300 may be connected to the power supply connection terminal 50-1 and the power supply connection terminal 50-2. Instead, different power supply terminals of the external power supply 300 may be connected respectively to the power supply connection terminal 50-1 and the power supply connection terminal 50-2.

The external power supply 300 charges the capacitor 20 that is not supplying power to the device under test 200, with a voltage corresponding to the content of the test to be performed after the test that uses the other capacitor 20, which is supplying power to the device under test 200. The following describes operations of the switching section 30 and the external power supply 300 in an example where the test apparatus 100 performs a test that involves using the capacitor 20-2 to apply the second voltage to the device under test 200 after performing a test that involves using the capacitor 20-1 to apply the first voltage to the device under test 200.

The external power supply 300 sets the voltage output to the capacitor 20-1 to be the first voltage and charges the capacitor 20-1 to the first voltage. When the capacitor 20-1 is charged to the first voltage, the switching section 30 turns ON the switch 32-1 to supply the device under test 200 with the power charged in the capacitor 20-1. Furthermore, the external power supply 300 sets the voltage output to the capacitor 20-2 to be the second voltage. While the supply power charged in the capacitor 20-1 is being supplied to the device under test 200, the external power supply 300 charges the capacitor 20-2, which is not supplying power to the device under test 200, to the second voltage.

When the test using the capacitor 20-1 is finished, the switching section 30 turns OFF the switch 32-1. When the capacitor 20-2 is charged to the second voltage, the switching section 30 turns ON the switch 32-2. The capacitor 20-2 supplies the power charged therein to the device under test 200. The external power supply 300 may set the first voltage and the second voltage to be the same, depending on the content of the testing. In this way, even when the test apparatus 100 does not include the power supply section 60 therein, the test apparatus 100 can achieve the same affect as the test apparatus 100 shown in FIG. 1.

Figure 4:
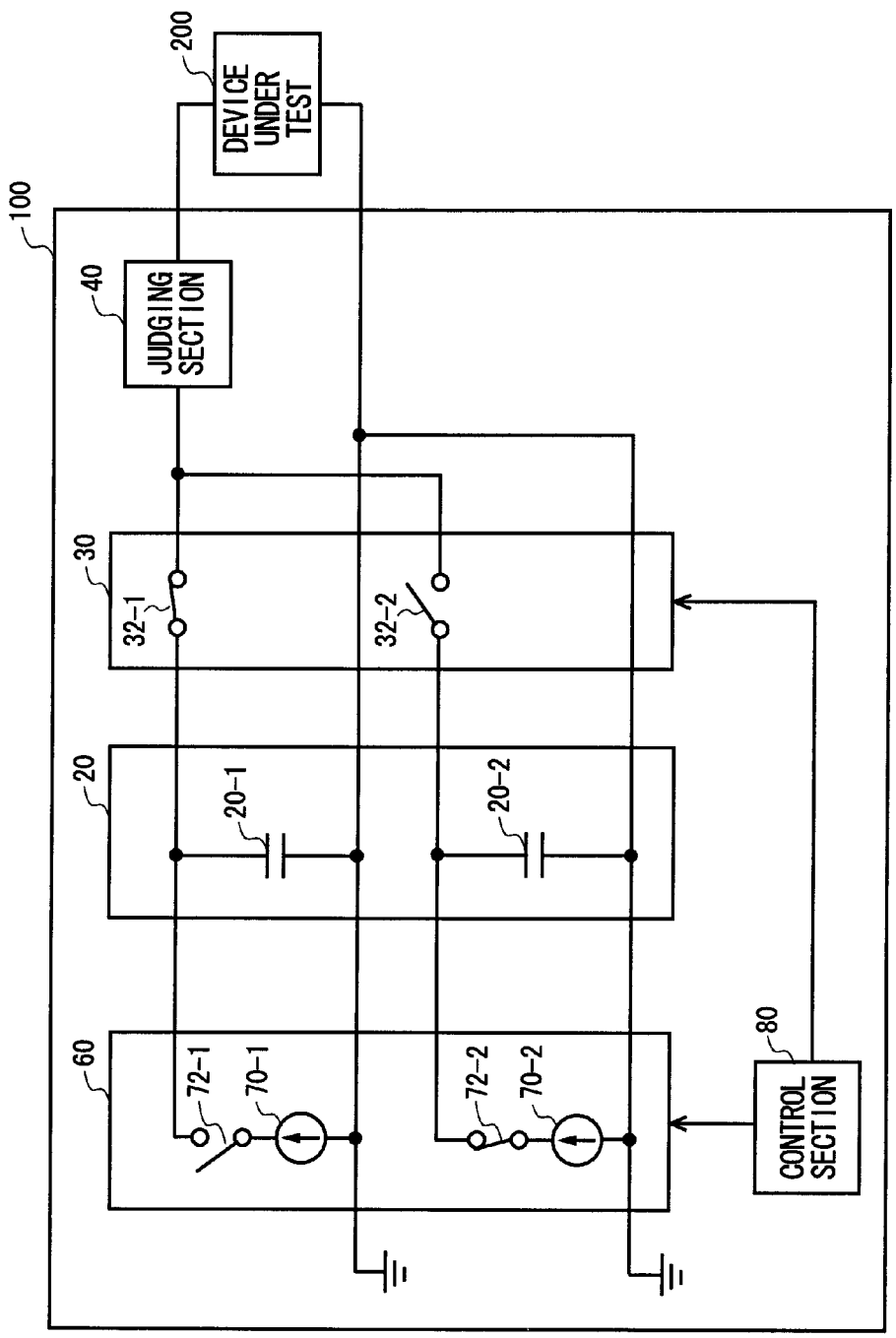
FIG. 4 shows a configuration of the test apparatus 100 according to another embodiment, along with the device under test 200.

FIG. 4 shows a configuration of the test apparatus 100 according to another embodiment, along with the device under test 200. In the test apparatus 100 of FIG. 4, the power supply section 60 differs from the power supply section 60 of FIG. 2 by including a plurality of power supply units 70-1 and 70-2 and a plurality of switches 72. The power supply unit 70-1 is connected between the ends of the capacitor 20-1 via the switch 72-1, and charges the capacitor 20-1. The power supply unit 70-2 is connected between the ends of the capacitor 20-2 via the switch 72-2, and charges the capacitor 20-2.

The switch 72-1 switches whether the power supply unit 70-1 is connected to the capacitor 20-1. The switch 72-2 switches whether the power supply unit 70-2 is connected to the capacitor 20-2. The power supply section 60 turns ON the switch 72-1 when charging the capacitor 20-1 with the power supply unit 70-1. The power supply section 60 turns OFF the switch 72-1 when the capacitor 20-1 is not being charged with the power supply unit 70-1. Similarly, the power supply section 60 turns ON the switch 72-2 when charging the capacitor 20-2 with the power supply unit 70-2. The power supply section 60 turns OFF the switch 72-2 when the capacitor 20-2 is not being charged with the power supply unit 70-2.

The switching section 30 selects one of the capacitors 20 and the corresponding power supply unit 70, according to the content of a test to be performed after a test using one of the capacitors 20 to supply power to the device under test 200. For example, the switching section 30 may select one of the capacitor 20-1 and the capacitor 20-2 and one of the power supply unit 70-1 and the power supply unit 70-2, according to the amount of voltage applied to the device under test 200. The switching section 30 may select one of the capacitor 20-1 and the capacitor 20-2 and one of the power supply unit 70-1 and the power supply unit 70-2 according to the amount of current to be passed to the device under test 200.

When the device under test 200 is tested by having the first voltage and the second voltage applied thereto, the power supply unit 70-1 may set the voltage output to the capacitor 20-1 to be the first voltage to charge the capacitor 20-1 to the first voltage. When the capacitor 20-1 is charged to the first voltage, the switching section 30 turns ON the switch 32-1 to supply the device under test 200 with the supply power charged in the capacitor 20-1. While the supply power charged in the capacitor 20-1 is being supplied to the device under test 200, the power supply unit 70-2 sets the voltage output to the capacitor 20-2 to be the second voltage and charges the capacitor 20-2, which is not supplying power, to the second voltage.

The control section 80 may control the voltage output by the power supply unit 70-1 and the power supply unit 70-2. The control section 80 may also control the switching section 30. The control section 80 may control the timing at which the power supply unit 70-1 and the power supply unit 70-2 output voltage to be in synchronization with the timing of the switching between the ON and OFF states of the switch 32-1 and the switch 32-2. For example, the control section 80 may connect the power supply unit 70-1 to the capacitor 20-1 by turning ON the switch 72-1 after the switch 32-1 is turned OFF. Furthermore, the control section 80 may disconnect the power supply unit 70-1 from the capacitor 20-1 by turning OFF the switch 72-1 before turning ON the switch 32-1.

When the amount of current needed to test the device under test 200 is greater than a predetermined amount, the switching section 30 connects both the capacitor 20-1 and the capacitor 20-2 to the device under test 200 in parallel. When the current to be passed to the device under test 200 is greater than the current that can be supplied by either the capacitor 20-1 or the capacitor 20-2, the switching section 30 turns ON the switch 32-1 and the switch 32-2 at the same time. The necessary current may be a maximum current, or may be an average current within a prescribed time.

For example, when a current of 2 kA is necessary for the device under test 200 but the capacitor 20-1 and the capacitor 20-2 can each supply a current of only 1 kA, the switching section 30 turns ON the switch 32-1 and the switch 32-2 at the same time. By turning on the switch 32-1 and the switch 32-2 at the same time, a current of 1 kA is supplied from each of the capacitor 20-1 and the capacitor 20-2, and so a total current of 2 kA is supplied to the device under test 200.

The test apparatus 100 may include n capacitors 20 and n corresponding power supply units 70, where n is an integer greater than 2. When the current necessary for testing the device under test 200 is m times the current that can be supplied by each capacitor 20, where m is a natural number, the switching section 30 may connect a number of capacitors 20 corresponding to the minimum integer greater than m in parallel to the device under test 200.

The test apparatus 100 may include a number of capacitors 20 according to a relationship between the charging time T of the capacitors 20 and the testing time t for supplying power to the device under test 200. For example, when T is k times t, where k is a natural number, the test apparatus 100 may include a number of capacitors 20 substantially equal to k. By sequentially connecting to the device under test 200 a number of capacitors 20 substantially equal to k, the switching section 30 can perform a series of tests on the device under test 200 without waiting for the capacitors 20 to charge, thereby further shortening the test time.

Figure 5:
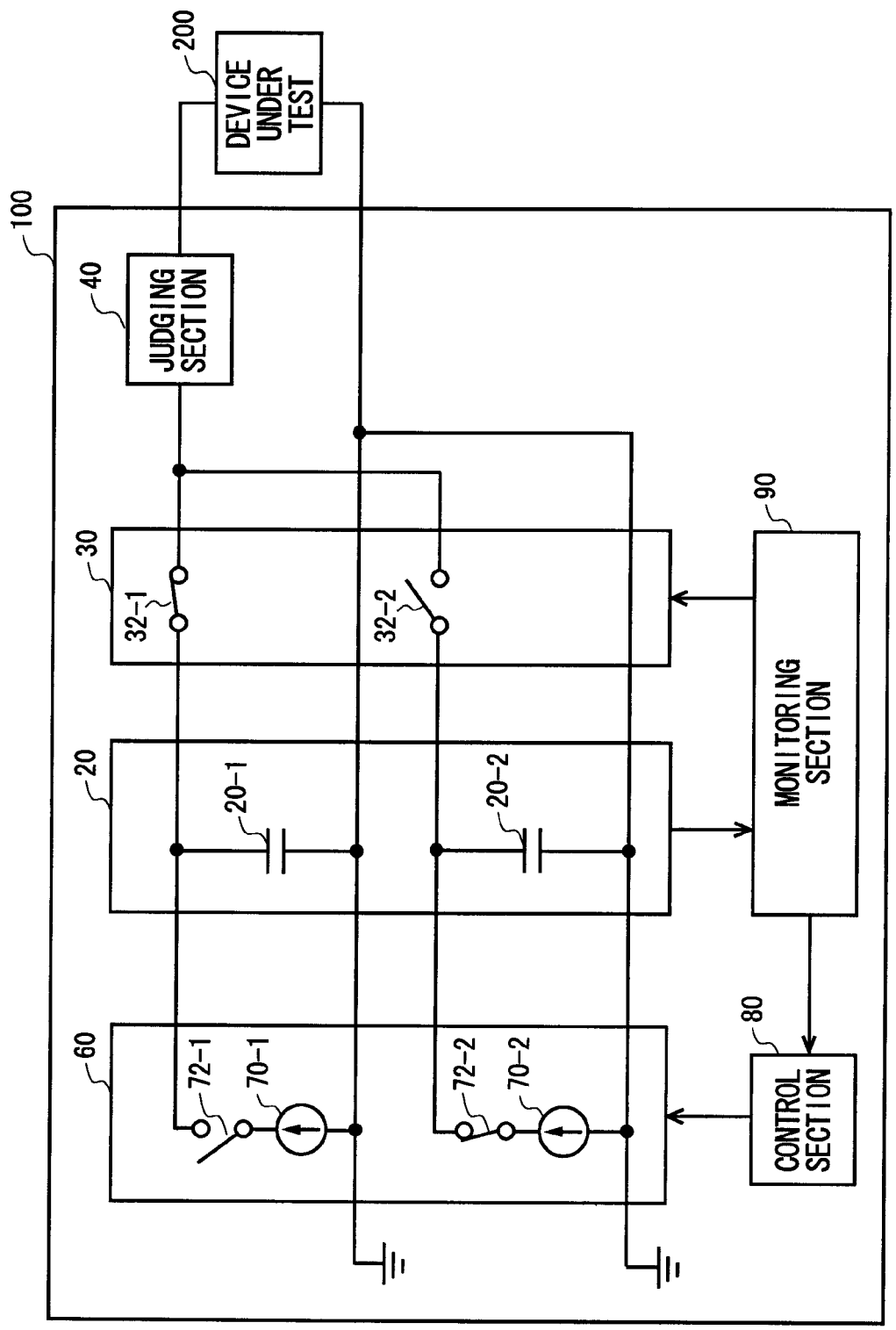
FIG. 5 shows a configuration of the test apparatus 100 according to another embodiment, along with the device under test 200.

FIG. 5 shows a configuration of the test apparatus 100 according to another embodiment, along with the device under test 200. The test apparatus 100 of FIG. 5 further includes a monitoring section 90 in addition to the configuration of the test apparatus 100 of FIG. 4. The monitoring section 90 monitors degradation of the plurality of capacitors 20.

For example, the monitoring section 90 may monitor the charge and discharge time of the capacitors 20. The charge time may be the time that it takes for a capacitor charged to a first prescribed voltage to finish being charged to a second prescribed voltage. The discharge time may be the time that it takes for a capacitor charged to the second prescribed voltage to discharge until reaching the first prescribed voltage. The monitoring section 90 may determine the degradation according to the charge time or the discharge time of a capacitor 20. More specifically, when the charge time or the discharge time of a capacitor 20 is less than a predetermined time, the monitoring section 90 may determine that degradation has caused the electrostatic capacitance of this capacitor 20 to drop.

The monitoring section 90 may determine which level of degradation a capacitor 20 is at, from among a plurality of degradation levels, based on the value of the charge time or discharge time. For example, when a capacitor 20 has a charge time of 100 milliseconds in an initial state, the monitoring section 90 may determine this capacitor to be at a first level of degradation when this charge time becomes 90 milliseconds and to be at a second level of degradation when this charge time becomes 80 milliseconds.

The monitoring section 90 may display a warning when the degradation information corresponding to the degradation amount indicates a value in a predetermined range. The monitoring section 90 may generate the degradation information as a ratio of the charge or discharge time of a capacitor 20 to the initial charge or discharge time of the capacitor 20. More specifically, when the initial charge or discharge time is 100 milliseconds, the monitoring section 90 may set the degradation information to be 0.9 when the charge or discharge time is 90 milliseconds and to be 0.8 when the charge or discharge time is 80 milliseconds. The monitoring section 90 may display a warning when the degradation information corresponding to the capacitor 20-1 or the capacitor 20-2 drops below 0.8, for example.

The monitoring section 90 may calculate the degradation information based on the number of times that a capacitor 20 is charged or discharged. Instead, the monitoring section 90 may calculate the degradation information based on the voltage difference between the capacitor 20 in a charged and a discharged state and on the number of charges or discharges. The monitoring section 90 may calculate the degradation information for each of the capacitor 20-1 and the capacitor 20-2, and may store the degradation information in association with the capacitor 20-1 and the capacitor 20-2.

The monitoring section 90 may notify the control section 80 concerning the degradation information. The control section 80 controls the power supply section 60 based on the received degradation information. When the degradation information for one of the capacitors 20 indicates a value in a predetermined range, the power supply section 60 may charge this capacitor 20 to a voltage that is lower than the voltage charged before the degradation information indicated a value in the predetermined range. The power supply section 60 may determine the voltage to be charged based on the value of the degradation information.

More specifically, in a case where the capacitor 20-1 is charged to 1 kV when the degradation information indicates a value of 0.8 or more, when the degradation information for this capacitor 20-1 drops below 0.8, the capacitor 20-1 may be charged to a voltage less than 0.8 kV. The switching section 30 uses this capacitor 20-1 for tests that can be conducted with this voltage. The control section 80 may receive the degradation information corresponding to the capacitor 20-1 and the capacitor 20-2, and control the voltage of the power supply unit 70-1 and the power supply unit 70-2 according to this degradation information. The test apparatus 100 can use the capacitors 20 over a longer period with the control described above.

When the degradation information of the capacitor 20-1 or the capacitor 20-2 changes, the switching section 30 may change the switching order of the switch 32-1 and the switch 32-2. When the degradation information for each of the capacitor 20-1 and the capacitor 20-2 is 1.0, the capacitor 20-1 and the capacitor 20-2 can apply a first voltage, i.e. 1 kV, or a second voltage, i.e. 0.8 kV, to the device under test 200. Accordingly, even if five tests are performed in which four tests involve applying the first voltage and one test involves applying the second voltage, the switching section 30 can perform the tests by sequentially using the capacitor 20-1 and the capacitor 20-2.

When the degradation information for the capacitor 20-2 drops below 0.8, the capacitor 20-2 cannot be used for tests that that involve applying 1 kV. Therefore, the switching section 30 may switch the switch 32-1 and the switch 32-2 in a manner to use the capacitor 20-1 when performing a test that involves applying the first voltage and to use the capacitor 20-2 when performing tests that involve applying the second voltage. With this control, even when one of the capacitors 20 is degraded, the test apparatus 100 can use the degraded capacitor 20 for testing the device under test 200.

The test apparatus 100 may use the capacitor 20-1 and the capacitor 20-2 with different frequencies, according to the degradation information of the capacitor 20-1 and the capacitor 20-2. For example, when the degradation information of the capacitor 20-1 indicates a greater value than the degradation information of the capacitor 20-2, in other words, when the capacitor 20-2 is more degraded than the capacitor 20-1, the test apparatus 100 may test the device under test 200 while using the capacitor 20-1 more frequently than the capacitor 20-2. With this control, the test apparatus 100 can maintain uniform degradation among the capacitor 20-1 and the capacitor 20-2.

Figure 6:
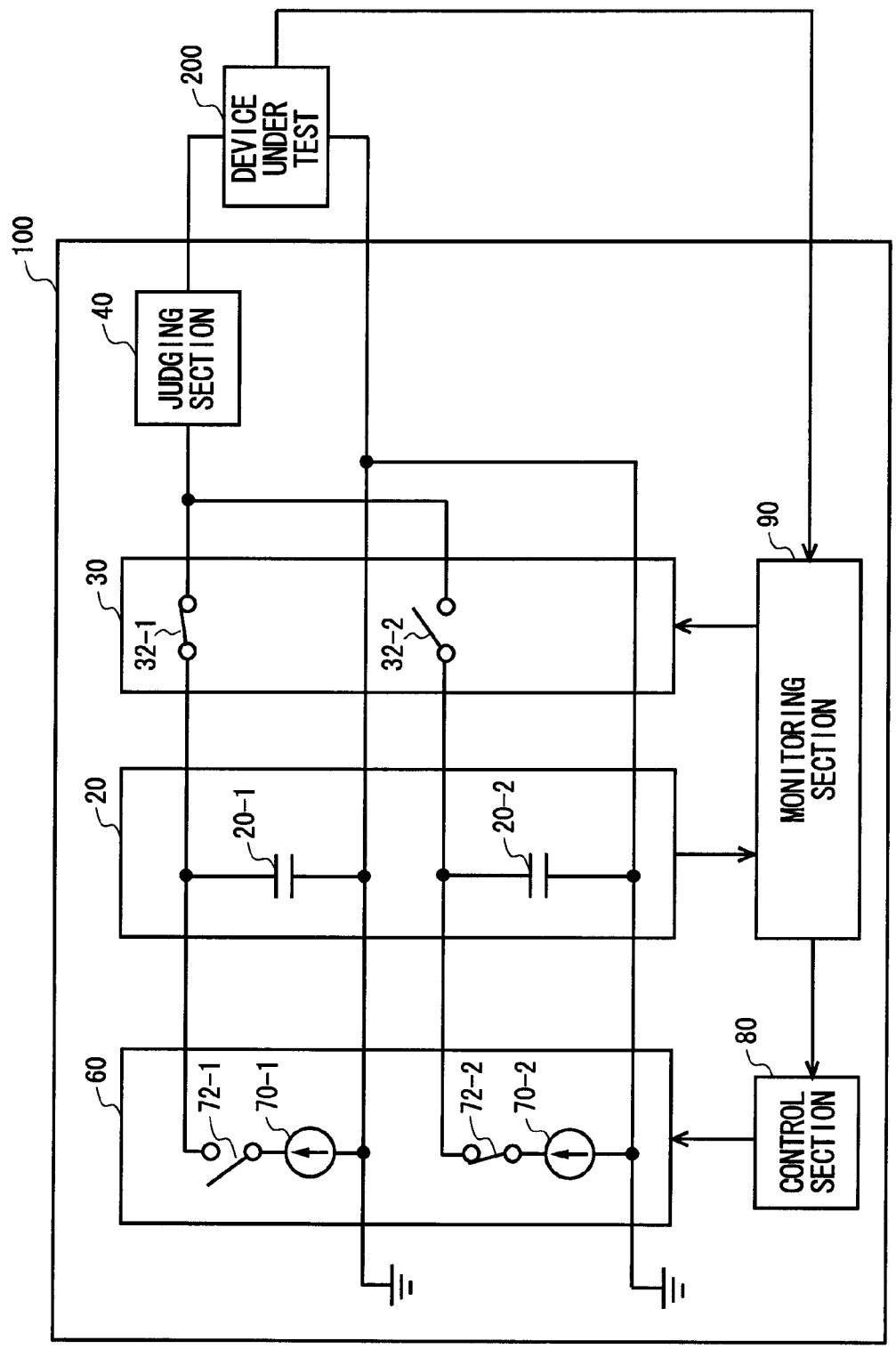
FIG. 6 shows a configuration of the test apparatus 100 according to another embodiment, along with the device under test 200.

FIG. 6 shows a configuration of the test apparatus 100 according to another embodiment, along with the device under test 200. The switching section 30 stops the supply of power to the device under test 200 from the capacitors 20, according to the operation of the device under test 200. For example, the device under test 200 may input a state notification signal, which indicates that an abnormality due to excessive current or excessive voltage has occurred, to the monitoring section 90. The monitoring section 90 may receive the state notification signal from the device under test 200 and control the switching section 30.

More specifically, upon receiving the state notification signal indicating an abnormality in the device under test 200, the monitoring section 90 instructs the switching section 30 to turn OFF the switch 32-1 and the switch 32-2. The switching section 30 stops the supply of power to the device under test 200 by turning OFF the switch 32-1 and the switch 32-2 in response to the instructions from the monitoring section 90.

The monitoring section 90 may detect an abnormality in the device under test 200 based on the current value detected by the judging section 40. The switching section 30 receives the state notification signal directly from the device under test 200 and turns OFF the switch 32-1 and the switch 32-2.

By providing the switching section 30 with an output cutting function as describe above, when an abnormality occurs in the device under test 200, the supply of power to the device under test 200 can be stopped quickly. As a result, physical damage to the device under test 200 can be prevented, such as excessive heating due to the device under test 200 being defective. Furthermore, damage is prevented from spreading to peripheral circuits of the test apparatus 100 or the like around the device under test 200.

Figure 7A:
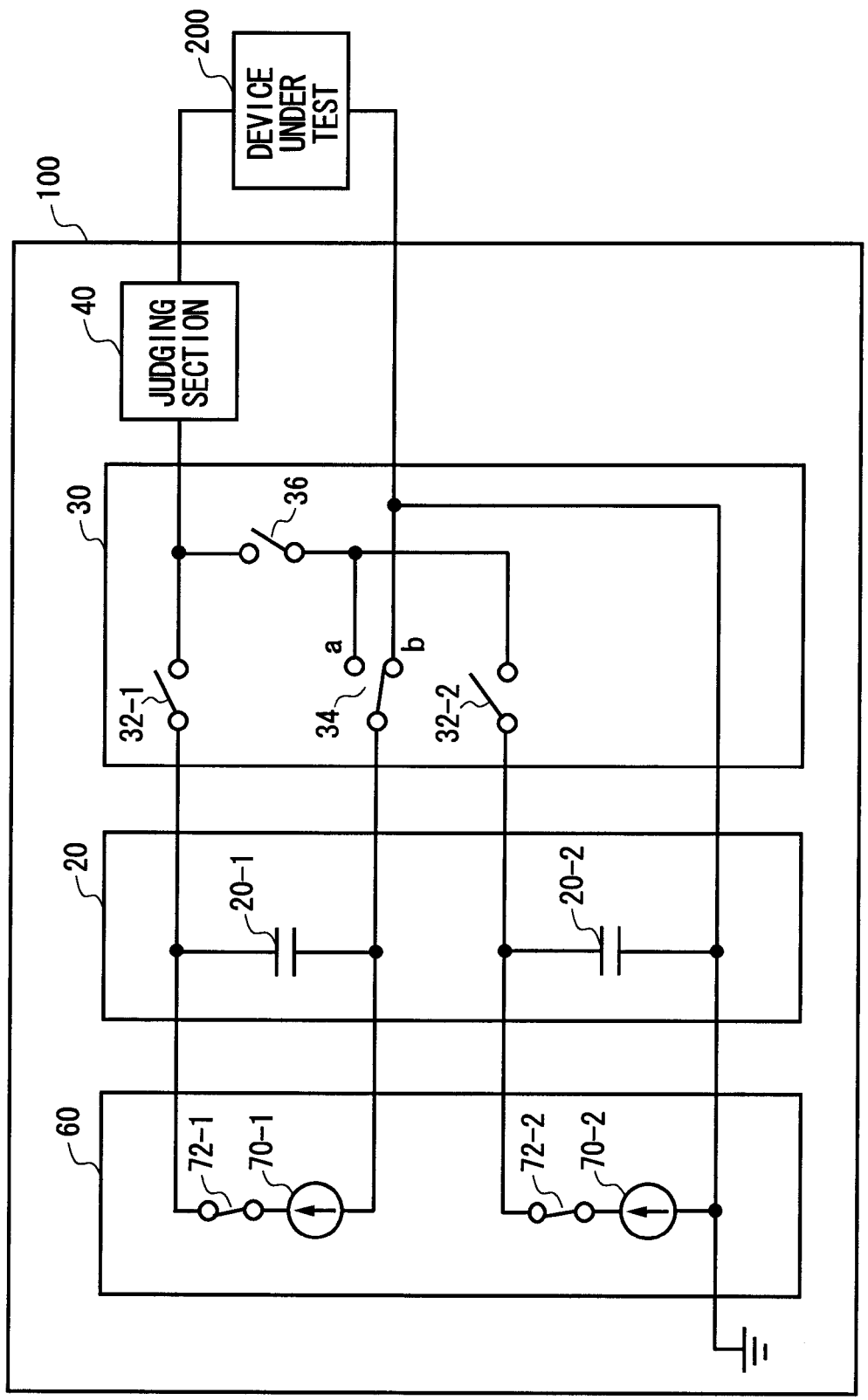
FIG. 7A shows a configuration of the test apparatus 100 according to another embodiment, along with the device under test 200.
Figure 7B:
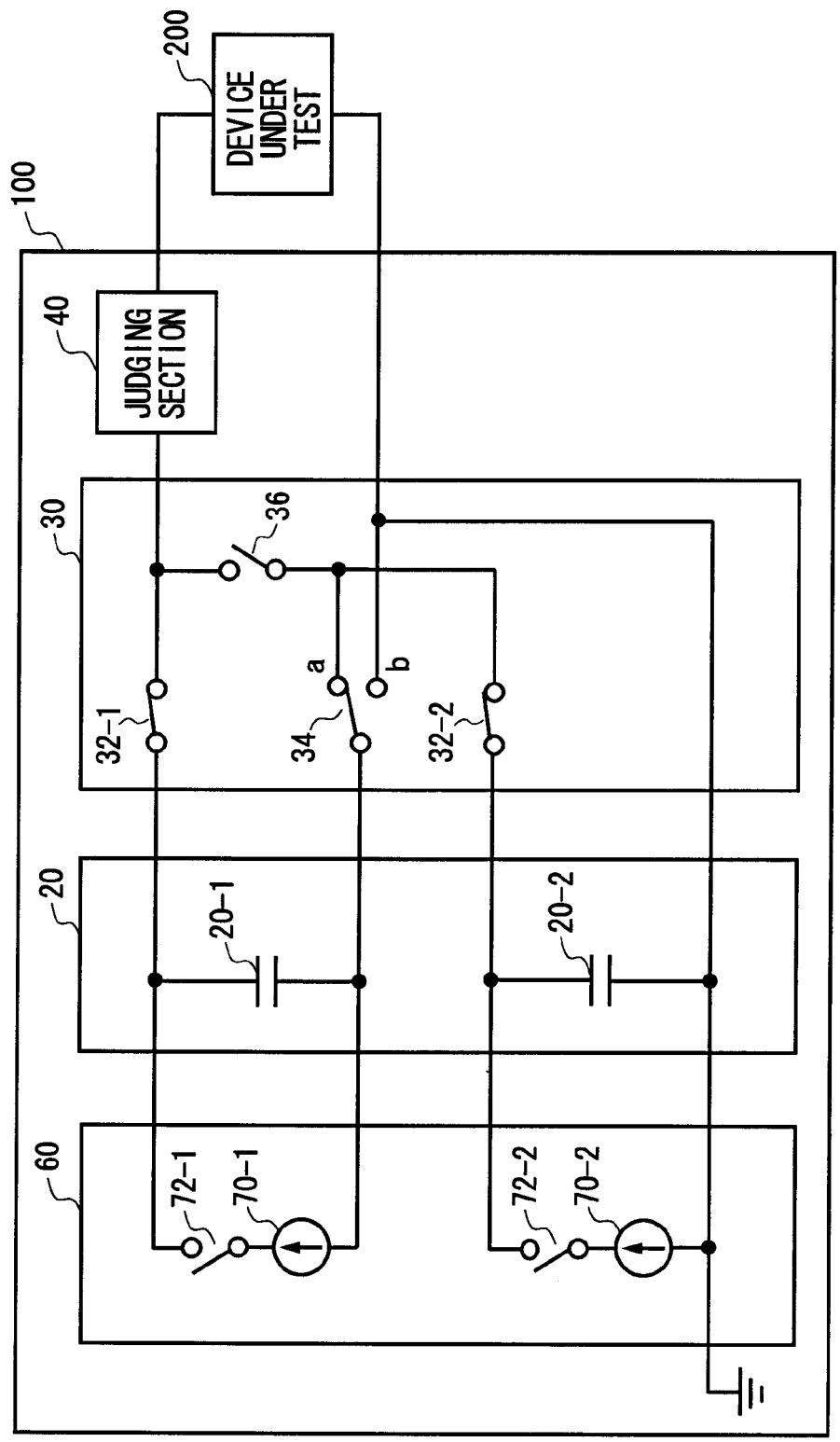
FIG. 7B shows a configuration of the test apparatus 100 according to another embodiment, along with the device under test 200.

FIGS. 7A and 7B show a configuration of the test apparatus 100 according to another embodiment, along with the device under test 200. In the test apparatus 100 of the present embodiment, the switching section 30 further includes a switch 34 and a switch 36 in addition to the configuration of the switching section 30 shown in FIG. 4. The switching section 30 controls the switch 32-1, the switch 32-2, the switch 34, and the switch 36 to connect two or more capacitors 20, from among a plurality of capacitors 20, to the device under test 200 in series.

More specifically, when the capacitor 20-1 and the capacitor 20-2 are to be connected in series and used, the switching section 30 turns OFF the switch 36. When charging the capacitor 20-1 and the capacitor 20-2, the switching section 30 turns OFF the switch 32-1 and the switch 32-2. Furthermore, the switching section 30 switches the switch 34 to a b-side to connect the ground-side terminals of the capacitor 20-1 and the capacitor 20-2 to each other.

The power supply section 60 switches the switch 72-1 and the switch 72-2 to connect the power supply unit 70-1 and the power supply unit 70-2 respectively to the capacitor 20-1 and the capacitor 20-2. In this state, the capacitor 20-1 is charged with the voltage output by the power supply unit 70-1 and the capacitor 20-2 is charged with the voltage output by the power supply unit 70-2.

Next, when the power charged in the capacitor 20-1 and the capacitor 20-2 is supplied to the device under test 200, the switch 72-1, the switch 72-2, the switch 32-1, the switch 32-2, the switch 34, and the switch 36 are switched to the positions shown in FIG. 7B. In other words, the switching section 30 turns ON the switch 32-1 and the switch 32-2. Furthermore, the switching section 30 switches the switch 34 to the a-side, to connect the ground-side terminal of the capacitor 20-1 to the power-supply-side terminal of the capacitor 20-2. The power supply section 60 switches the switch 72-1 and the switch 72-2 to disconnect the power supply unit 70-1 and the power supply unit 70-2 from the capacitor 20-1 and the capacitor 20-2.

As a result of the switching section 30 and the power supply section 60 switching the switch 72-1, the switch 72-2, the switch 32-1, the switch 32-2, the switch 34 and the switch 36 to the positions shown in FIG. 7B, the capacitor 20-1 and the capacitor 20-2 are connected in series. Therefore, a voltage difference, which corresponds to a value obtained as the sum of the voltage charged in the capacitor 20-1 and the voltage charged in the capacitor 20-2, occurs between the power-supply-side terminal of the capacitor 20-1 and the ground-side terminal of the capacitor 20-2. In other words, this voltage sum is applied to the device under test 200. For example, when the capacitor 20-1 and the capacitor 20-2 are each charged to 1 kV, the voltage of 2 kV between the power-supply-side terminal of the capacitor 20-1 and the ground-side terminal of the capacitor 20-2 is applied to the device under test 200.

By connecting the capacitor 20-1 and the capacitor 20-2 in series as described above, a voltage that cannot be applied using a single capacitor 20 can be applied to the device under test 200. By switching the ON and OFF states of the switch 36 according to the voltage for testing the device under test 200, the test apparatus 100 can use the capacitor 20-1 and the capacitor 20-2 in a parallel connection or in a serial connection.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a test apparatus and a power supply apparatus that can reduce testing time.

What is claimed is:

1. A test apparatus that tests a device under test, comprising:
   a first capacitor and a second capacitor;
   a switching section that (i) switches which of the first capacitor and the second capacitor supplies power to the device under test and (ii), when the first capacitor and the second capacitor supply power to the device under test, switches, according to a test voltage for testing the device under test, whether the first capacitor and the second capacitor are used in a parallel connection or in a serial connection;
   a judging section that judges acceptability of the device under test based on an operational result of the device under test;
   a power supply section that includes a first power supply unit that charges the first capacitor and a second power supply unit that charges the second capacitor; and
   a monitoring section that monitors degradation amounts of the first capacitor and the second capacitor, wherein
   the switching section has states comprising:
      a first state in which the second capacitor is electrically connected to the device under test but the first capacitor and the second capacitor are not connected to the device under test in series;
      a second state in which the first capacitor is electrically connected to the device under test but the first capacitor and the second capacitor are not connected to the device under test in series;
      a third state in which neither the first capacitor nor the second capacitor is electrically connected to the device under test, and a negative terminal of the first capacitor and a negative terminal of the second capacitor are connected to each other; and
      a fourth state in which the first capacitor and the second capacitor are connected to the device under test in series, and
   the power supply section (i) causes the first capacitor to connect to the first power supply unit when the switching section is in the first state, (ii) causes the second capacitor to connect to the second power supply unit when the switching section is in the second state, (iii) causes the first capacitor to connect to the first power supply unit, charges the first capacitor with the first power supply unit, causes the second capacitor to connect to the second power supply unit, and charges the second capacitor with the second power supply unit when the switching section is in the third state, and (iv) causes the first capacitor not to connect to the first power supply unit and causes the second capacitor not to connect to the second power supply unit when the switching section is in the fourth state.

2. The test apparatus according to claim 1, wherein
when an amount of current needed to test the device under test is greater than a predetermined value, the switching section connects the first capacitor and the second capacitor to the device under test in parallel.

3. The test apparatus according to claim 2, wherein
the monitoring section displays a warning when degradation information corresponding to the degradation amounts indicates a value in a predetermined range.

4. The test apparatus according to claim 3, wherein
when the degradation information of the first capacitor or the second capacitor indicates a value within the predetermined range, the power supply section charges the capacitor whose degradation information indicates the value in the predetermined range to a voltage that is less than a voltage to which the capacitor was charged before the degradation information indicated the value in the predetermined range.

5. The test apparatus according to claim 3, wherein
the monitoring section monitors the degradation amounts of the first capacitor and the second capacitor based on charge time or discharge time of the first capacitor and the second capacitor.

6. The test apparatus according to claim 3, wherein
the switching section switches to the first state or the second state according to a voltage to be applied to the device under test when the degradation information changes.

7. The test apparatus according to claim 1, wherein
the switching section stops the supply of power to the device under test from the first capacitor or the second capacitor according to operation of the device under test.

8. The test apparatus according to claim 1, wherein
the negative terminal of the first capacitor is connected to a negative terminal of the first power supply unit and the negative terminal of the second capacitor is connected to a negative terminal of the second power supply unit.

9. The test apparatus according to claim 1, wherein
the test apparatus comprises n capacitors including the first capacitor and the second capacitor, n being an integer greater than two,
the power supply section includes n power supply units including the first power supply unit and the second power supply unit, the n power supply units respectively corresponding to the n capacitors, and
the switching section switches which of the n capacitors supplies power to the device under test.

10. The test apparatus according to claim 1, wherein
the switching section includes:
   a first switch that is provided between a positive terminal of the first capacitor and a positive power supply terminal of the device under test and switches whether the positive terminal of the first capacitor is connected to the positive power supply terminal of the device under test;
   a second switch that is provided between a positive terminal of the second capacitor and the positive power supply terminal of the device under test and switches whether the positive terminal of the second capacitor is connected to the positive power supply terminal of the device under test;
   a third switch that switches whether (i) the negative terminal of the first capacitor is connected to the positive terminal of the second capacitor via the second switch or (ii) the negative terminal of the first capacitor is connected to the negative terminal of the second capacitor, which is connected to a negative power supply terminal of the device under test.

* * * * *